United States Patent

[11] 3,611,195

[72] Inventors O. D. Parham
Downey, Calif.;
Hughes Aircraft Company, Culver City, Calif.
[21] Appl. No. 855,007
[22] Filed Sept. 3, 1969
[45] Patented Oct. 5, 1971

[54] VARIABLE FREQUENCY OSCILLATOR AND MODULATOR CIRCUITS INCLUDING COLPITTS TRANSISTOR AND FEEDBACK TRANSISTOR
10 Claims, 13 Drawing Figs.

[52] U.S. Cl. 332/16 T, 307/233, 329/103, 329/122, 331/115, 331/117, 332/18
[51] Int. Cl. H03c 3/08
[50] Field of Search 329/122, 103, 134; 332/16, 16 T, 18, 19; 331/117, 115; 307/233

[56] References Cited

UNITED STATES PATENTS 2,770,731 11/1956 Boff et al. 331/115
2,820,145 1/1958 Wolfendale 331/115
2,851,540 9/1958 Theriault 332/16 T X
3,267,397 8/1966 Skinner 331/115 X
3,360,745 12/1967 Kretzmer 331/117 X

*Primary Examiner*—Alfred L. Brody
*Attorneys*—James K. Haskell and Paul M. Coble

ABSTRACT: The basic variable frequency oscillator circuit includes a transistor connected in a Colpitts configuration. An effective tank circuit capacitance is varied in accordance with a control signal to vary the circuit oscillation frequency. When the effective capacitance is provided by the transistor base-emitter capacitance, the frequency variation may be achieved by varying the transistor emitter current or the collector-base voltage. Alternatively, the effective capacitance may be varied by varying the transconductance of a second transistor coupled in a feedback arrangement with the Colpitts transistor. Frequency modulation may be achieved when a modulating voltage is used as the control signal. Circuit variations involving phase locking of the feedback employing embodiment onto an input signal include a frequency demodulator, a phase modulator and an amplitude modulation limiter. Further variations include a harmonic signal generator and frequency multiplier/divider circuits.

INVENTOR.
O.D. PARHAM,
BY
Paul M. Coble
ATTORNEY.

VARIABLE FREQUENCY OSCILLATOR AND MODULATOR CIRCUITS INCLUDING COLPITTS TRANSISTOR AND FEEDBACK TRANSISTOR

This invention relates to electronic transistor circuits, and more particularly relates to variable frequency oscillator circuits which may be used to perform frequency and phase modulation, frequency demodulation, amplitude modulation limiting, harmonic signal generation, and frequency multiplication and division.

It is an object of the present invention to provide a variable frequency oscillator circuit in which the circuit oscillation frequency can be changed at a rate substantially faster than comparable variable frequency oscillators of the prior art.

It is a further object of the present invention to provide a frequency modulator circuit which, in addition to having rapid oscillation rate variation capabilities, is operable over a considerably wider frequency range of modulating voltages than with comparable prior art frequency modulator circuits.

It is still further object of the present invention to provide a frequency modulator circuit in which undesired amplitude variations in the frequency-modulated output waveform are minimized.

It is another object of the present invention to provide a phase-locked frequency modulation demodulator circuit which is able to phase lock onto an incoming carrier signal faster than any known phase-locked demodulator of the prior art.

It is a further object of the present invention to provide a phase-locked demodulator circuit which requires minimum circuitry and which provides improved demodulated signal-to-noise characteristics.

It is yet another object of the present invention to provide a phase modulator circuit in which the resultant phase modulation is a more linear function of the modulating voltage amplitude than any known phase modulator of the prior art.

It is a still further object of the present invention to provide a phase modulator circuit which is operable over a wide frequency range of modulating voltages and which provides an output voltage waveform having minimum undesired amplitude excursions due to the phase modulation.

It is still another object of the present invention to provide an amplitude modulation limiter circuit in which amplitude modulation limiting is afforded with essentially no AM to PM (amplitude modulation to phase modulation) conversion.

It is yet a further object of the present invention to provide a harmonic generator circuit capable of generating a wide range of harmonic frequency signals, and which harmonic signals have significant amplitudes relative to that of the fundamental frequency signal.

It is a still further object of the present invention to provide a frequency multiplier/divider circuit which is capable of performing both integral and fractional frequency multiplication and which is able to perform frequency division with higher frequencies than has been achieved with known circuits of the prior art.

It is a still further object of the present invention to provide a frequency multiplier/divider circuit capable of performing frequency modulation index multiplication or division while retaining the original carrier frequency.

In accordance with the foregoing objects, a variable frequency oscillator circuit according to the invention includes a transistor and circuitry for providing an inductance between the base electrode of the transistor and a power supply terminal and for providing a capacitance between the transistor emitter electrode and a power supply terminal. The effective capacitance in parallel with the aforementioned inductance is varied in accordance with a control signal to vary the oscillation frequency of the circuit. This effective capacitance may be varied by varying the transistor emitter current or the voltage between the collector and base electrodes of the transistor. Operation as a frequency modulator may be achieved when the control signal is an amplitude-varying modulating signal.

In a further embodiment of the invention the aforementioned effective capacitance (hence the circuit oscillation frequency) is varied by varying the transconductance of a second transistor coupled in a feedback arrangement with the first-mentioned transistor in accordance with a control signal. Again, frequency modulation may be achieved when the control signal is an amplitude-varying modulating signal.

In a further embodiment of the invention, in which a phase-locked frequency modulation demodulator is provided, the aforementioned effective capacitance is varied in accordance with an error signal indicative of the frequency difference between a frequency-modulated input signal and a signal at the instantaneous oscillation frequency of the circuit to vary the instantaneous oscillation frequency of the circuit accordingly, causing the circuit to phase lock onto the carrier frequency of the input signal, and to produce an amplitude-varying signal indicative of the frequency modulation on the input signal.

In a still further embodiment of the invention, in which a phase modulator is provided, the aforementioned effective capacitance is varied in accordance with a signal indicative of the instantaneous phase difference between a carrier frequency input signal and a signal at the instantaneous oscillation frequency of the circuit to vary the instantaneous oscillation frequency of the circuit and to phase modulate the carrier frequency input signal accordingly.

In still another embodiment of the invention, wherein an amplitude modulation limiter is provided, the aforementioned effective capacitance is varied in accordance with a signal indicative of the instantaneous frequency difference between an amplitude-modulated carrier frequency input signal and a signal at the instantaneous oscillation frequency of the circuit to cause the circuit to phase lock onto the input carrier frequency and to produce a substantially constant amplitude signal at the input carrier frequency.

In yet another embodiment of the invention, wherein a harmonic signal generator is provided, the aforementioned effective capacitance is varied in accordance with a control signal to vary the fundamental and harmonic oscillation frequencies of the circuit. By passing the generated fundamental and harmonic frequency signals through a filter tuned essentially to the desired harmonic frequency, an output signal at the desired harmonic frequency may be obtained.

In a still further embodiment of the invention, providing frequency multiplication and division, the aforementioned effective capacitance is varied in accordance with a signal indicative of the frequency difference between an input signal and a signal at the instantaneous oscillation frequency of the circuit to vary the instantaneous oscillation frequency of the circuit accordingly and to produce respective signals at integral or fractional multiples of the input signal frequency. When these signals are passed through a filter tuned essentially to the desired integral or fractional multiple frequency, an output signal at the desired frequency may be obtained. When the input signal contains frequency modulation, the frequency deviation (hence the modulation index) of the frequency modulation is also changed by the selected integral or fractional multiple. By mixing the generated frequency-modulated integral or fractional multiple frequency signals with a signal at a predetermined frequency and by passing the resultant sum and difference frequency signals through a filter tuned essentially to the desired sum or difference frequency, multiplication or division of the modulation index of the frequency modulation on the original input signal may be achieved while retaining the original carrier frequency.

Additional objects, advantages and characteristic features of the invention will become more fully apparent from the following detailed description of preferred embodiments of the invention when considered in conjunction with the accompanying drawings in which.

Figures 1, 2, 3:
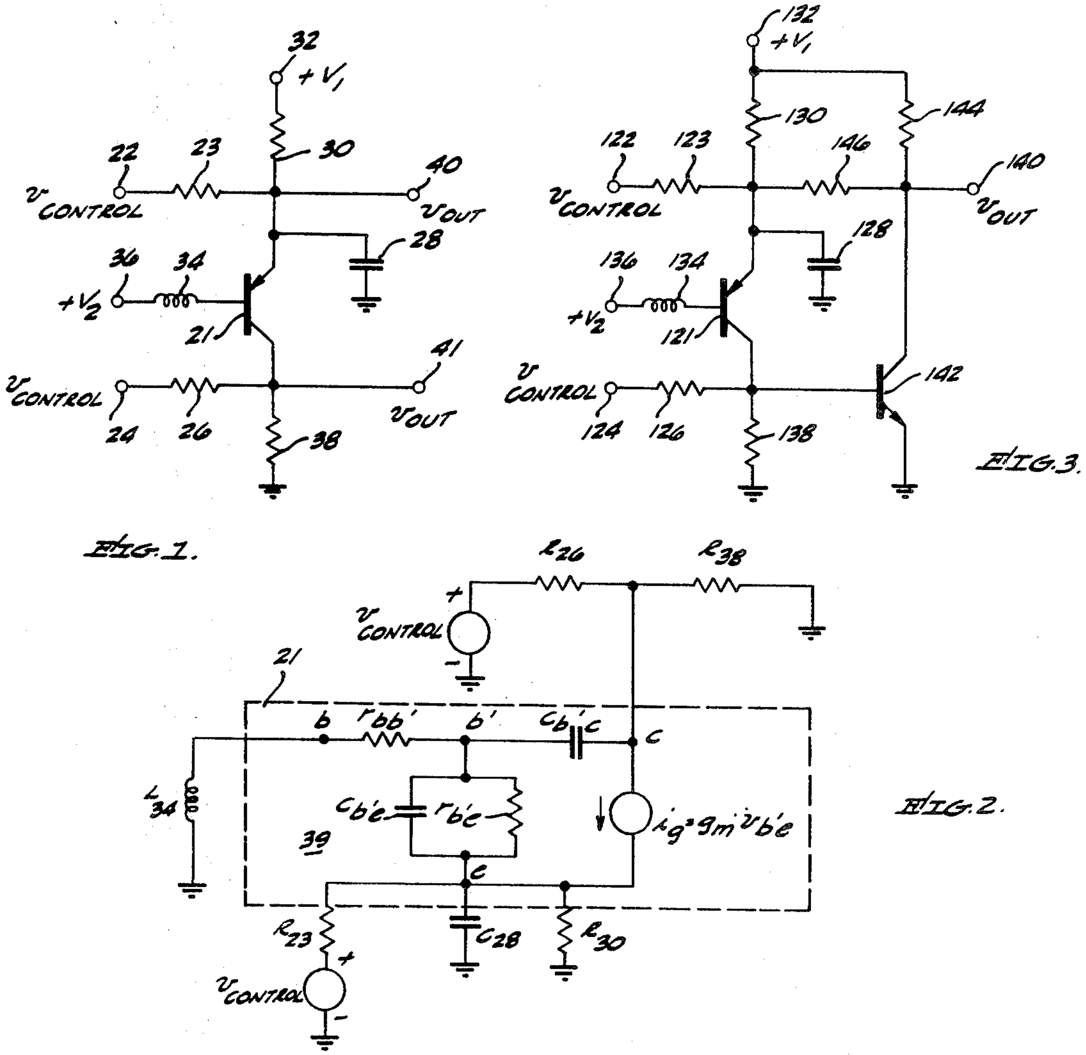
FIG. 1 is a schematic circuit diagram illustrating a basic variable frequency oscillator (and frequency modulator) circuit in accordance with an embodiment of the invention.
FIG. 2 is a schematic AC equivalent circuit diagram representing the behavior of the circuit of FIG. 1.
FIG. 3 is a schematic circuit diagram illustrating a variable frequency oscillator (and frequency modulator) circuit according to a further embodiment of the invention.

Referring with greater particularity to FIG. 1, a basic variable frequency oscillator circuit according to the invention may be seen to be constructed around a transistor 21 which, although illustrated as a PNP transistor, alternatively may be an NPN transistor in which case power supply voltage polarities would be used which are opposite to that shown in FIG. 1. The transistor 21 is preferably biased for Class A amplification.

A control voltage $v_{control}$ may be applied to the circuit either at a first input terminal 22 which is coupled via current determining resistor 23 to the emitter electrode of transistor 21 or at a second input terminal 24 which is coupled via a resistor 26 to the collector electrode of transistor 21. The emitter electrode of transistor 21 is coupled by means of a capacitor 28 to a level of reference potential illustrated as ground and is also coupled via a load resistor 30 to a power supply terminal 32 furnishing a voltage $+V_1$ which may be +12 volts, for example. An inductor 34 may be coupled between the base electrode of transistor 21 and a terminal 36 furnishing a power supply voltage $+V_2$ which may be +4 volts, for example.

A load resistor 38 is coupled between the collector electrode of transistor 21 and ground. Regardless of whether the control voltage $v_{control}$ is applied to terminal 22 or terminal 24, the output voltage $v_{out}$ may be taken from the circuit at either a first output terminal 40 connected to the emitter electrode of the transistor 21 or a second output terminal 41 connected to the transistor collector electrode.

A preferred application for the circuit of FIG. 1 is as a frequency modulator. In such an application the control voltage $v_{control}$ is an amplitude varying modulating voltage, and the output voltage $v_{out}$ becomes a carrier voltage which is frequency modulated in accordance with the amplitude of the input modulating voltage.

An AC equivalent circuit for the circuit of FIG. 1 is shown in FIG. 2, the equivalent circuit components representing the behavior of the transistor 21 appearing within dashed rectangle 21. The transistor base, emitter and collector electrodes are designated by the letters *b*, *e* and *c*, respectively, with the letter *b'* representing an internal point in the base circuit of the transistor. In addition, $r_{bb'}$ represents the base spreading resistance of the transistor, $r_{b'e}$ represents the effective resistance from the internal base point *b'* to the emitter electrode, $C_{b'e}$ represents the effective diffusion capacitance from the internal base point *b'* to the emitter electrode, $C_{b'c}$ represents the junction capacitance between the internal base point *b'* and the collector electrode (and is often referred to as the transistor $C_{ob}$), $i_g$ represents an equivalent generated current equal to $g_m\ v_{b'e}$ where $g_m$ is the transconductance of the transistor and is directly proportional to the emitter current $i_e$, and $v_{b'e}$ is the voltage appearing between the internal base point *b'* and the emitter electrode. For further details as to this transistor equivalent circuit, reference may be made to *Transistor Circuit Analysis* by Maurice V. Joyce and Kenneth K. Clarke, Addison-wesley Publishing Company, Inc., Reading, Mass., chapter 7–4, pages 227–228.

In addition, in the equivalent circuit of FIG. 2, $L_{34}$ represents the inductance of inductor 34; $C_{28}$ represents the capacitance of capacitor 28; and $R_{23}$, $R_{26}$, $R_{30}$ and $R_{38}$ represent the resistance of respective resistors 23, 26, 30 and 38.

The operation of the circuit of FIG. 1 will now be described with reference to the equivalent circuit of FIG. 2. The circuit functions as a Colpitts oscillator having a tank circuit 39 in which the tank circuit inductance is furnished by inductance $L_{34}$ and the tank circuit capacitive branches are provided by respective capacitances $C_{b'e}$ and $C_{28}$. In the absence of a control voltage at either of the circuit input terminals 22 or 24, the circuit oscillates at the natural resonant frequency $f_0$ at the frequency $f_0$, which is the output voltage (at terminal 40 or terminal 41, or both) at the frequency $f_0$, whikh is the carrier frequency of the output voltage $v_{out}$ when the circuit is used as a frequency modulator.

In order to vary the oscillation frequency of the circuit of FIG. 1, the resonant frequency of the tank circuit 39 is varied by changing the capacitance $C_{b'e}$ in accordance with a control signal. The capacitance $C_{b'e}$ is a function of the density of minority charge carriers in the transistor base region and is also a function of the electrical volume of the base region. Since the minority charge carrier density is a function of the transistor emitter current, the capacitance $C_{b'e}$ may be changed by varying the emitter current. Thus, when an amplitude varying control voltage $v_{control}$ is applied to input terminal 22, the emitter current of the transistor 21 (and hence the resonant frequency of the tank circuit 39) is changed in proportion to the amplitude variations of the control voltage, producing a corresponding change in the frequency of the output voltage $v_{out}$ at terminals 40 and 41.

Since a change in emitter current results in an essentially immediate change in the capacitance $C_{b'e}$ and essentially instantaneous change in the circuit oscillation frequency can be achieved with the circuit of FIG. 1 when the control voltage is applied to terminal 22. In typical prior art frequency modulator circuits, the oscillation frequency is changed by varying a varactor diode capacitance in accordance with an applied control voltage. However, since the rate at which voltage-driven variable capacitances are able to change is limited, the frequency of oscillation of such prior art circuits cannot be changed instantaneously. On the other hand, since the circuit of FIG. 1 (input at terminal 22) utilizes a current driven variable capacitance, the oscillation frequency theoretically can be changed instantaneously; in practice the rate of change of the oscillation frequency of such a circuit is orders of magnitude greater than that of prior art circuits. In fact, the rate of change of the oscillation frequency of this circuit appears to be limited by only the frequency response of transistor 21.

As has been mentioned above, the capacitance $C_{b'e}$ is also a function of the electrical volume of the transistor base region. This electrical volume is a function of the spreading of the depletion region at the collector-base junction, which in turn is dependent upon the collector-base voltage. Thus, the capacitance $C_{b'e}$ may also be changed by varying the voltage applied to the collector of the transistor 21. Accordingly, when the amplitude varying control voltage $v_{control}$ is applied to input terminal 24, the voltage at the collector of the transistor 21 is varied accordingly to produce a corresponding change in the circuit oscillation frequency.

When a modulating voltage is applied to terminal 24, the circuit of FIG. 1 does not provide as rapid a rate of change of oscillation frequency as when a modulating voltage is applied to terminal 22 because a voltage drive is employed rather than a current drive. However, although the capacitance $C_{b'c}$ is being varied, the driving voltage is applied to capacitance $C_{b'c}$. Since, typically, capacitance $C_{b'e}$ is around 10 $\mu\mu$f. while capacitance $C_{b'e}$ is essentially 500–1,000 $\mu\mu$f., capacitance $C_{b'e}$ is being changed by applying a voltage to another capacitance around 50 to 100 times smaller. Hence, the rate of change of the oscillation frequency of the circuit of FIG. 1 having a modulating voltage applied to a terminal 24, although not as fast as when the modulating voltage is applied to terminal 22, is nevertheless 50 to 100 times faster than frequency modulator circuits of the prior art. In addition, since a greater percentage of capacitance change can be achieved in the capacitive branch of the tank circuit with the circuit of FIG. 1 (regardless of where the modulating voltage is applied) than with prior art Colpitts frequency modulator circuits, the circuit of FIG. 1 is operable over a wider frequency range of modulating voltages than such prior art circuits.

FIG. 3 illustrates a variable frequency oscillator circuit according to a further embodiment of the present invention. The circuit of FIG. 3 is similar to that of FIG. 1, and hence corresponding components in the circuit of FIG. 3 are designated by the same second and third reference numeral digits as their counterpart components in the circuit of FIG. 1, the FIG. 3 components being further designated by the prefix numeral "1."

The circuit of FIG. 3 differs from that of FIG. 1 in that a feedback path including a second transistor 142 is provided for the transistor 121. The transistor 142 is preferably of a conductivity-type complementary to that of the transistor 121; hence, in the illustrated circuit, since the transistor 121 is shown as a PNP transistor, the transistor 142 is illustrated as of the NPN variety. The transistor 142 has its base electrode connected to the collector electrode of transistor 121 and has its emitter electrode coupled to ground. The collector electrode of transistor 142 is coupled via a load resistor 144 to power supply terminal 132. A feedback impedance, illustrated as a resistor 146, is coupled between the collector electrode of transistor 142 and the emitter electrode of transistor 121. The output voltage $v_{out}$ may be taken from the circuit at either the collector electrode or the emitter electrode of transistor 121 or the collector electrode of transistor 142. However, since it is preferred to obtain the circuit output from the collector electrode of transistor 142, output terminal 140 is shown as connected to this electrode.

Figure 4:
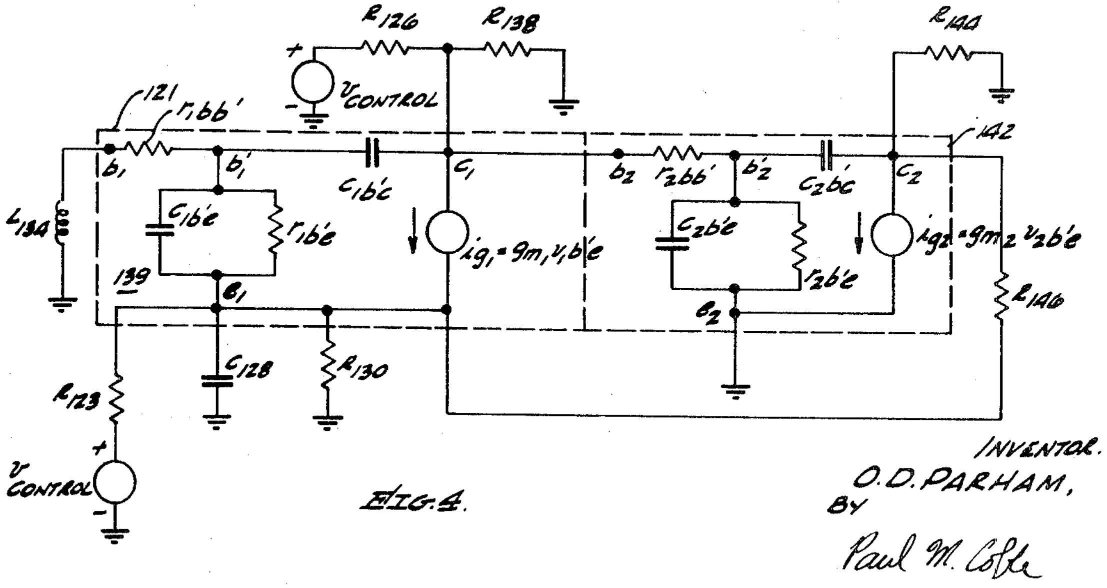
FIG. 4 is a schematic AC equivalent circuit diagram depicting the behavior of the circuit of FIG. 3.

An AC equivalent circuit for the circuit of FIG. 3 is shown in FIG. 4. The nomenclature used in FIG. 4 corresponds to the components of the circuit of FIG. 3 in the same way that the nomenclature of FIG. 2 corresponds to the components of the circuit of FIG. 1, as described above. Moreover, equivalent circuit components representing the behavior of transistor 121 appear within dashed rectangle 121 and are designated by the subscript "1," while equivalent circuit components representing the behavior of transistor 142 appear within dashed rectangle 142 and are designated by the subscript "2." In addition, in FIG. 4 $R_{144}$ and $R_{146}$ represent the resistance of respective resistors 144 and 146.

Figure 5:
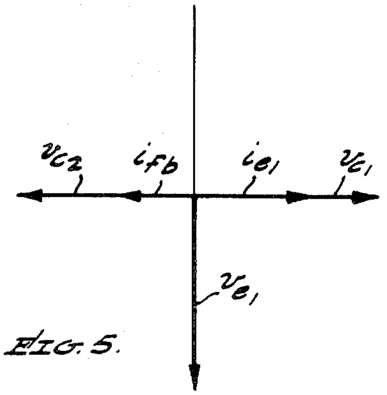
FIG. 5 is a vector diagram illustrating the currents and voltages at various points in the circuit of FIG. 3 and used in explaining the operation of the circuit of FIG. 3.

The operation of the circuit of FIG. 3 will now be described with reference to the equivalent circuit of FIG. 4 and the vector diagram of FIG. 5 illustrating currents and voltages at various points in the circuit of FIG. 3 as measured with respect to ground. The current $i_{e_1}$ at the emitter electrode of transistor 121 is in phase with the collector current of transistor 121, and hence is also in phase with the voltage $i_{e_1}$ at the collector electrode of transistor 121. However, the emitter current $i_{e_1}$ leads the voltage $v_{e_1}$ at the emitter electrode of transistor 121 by 90° due to the presence of capacitance $C_{128}$. The collector voltage $v_{c_1}$ of transistor 121 is applied to the base electrode of transistor 142 and, on account of a phase reversal in the transistor 142, the resultant voltage $v_{c_2}$ at the collector electrode of transistor 142 is 180° out of phase with the voltage $v_{c_1}$.

Figure 6:
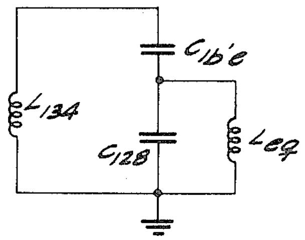
FIG. 6 is a simplified equivalent circuit diagram depicting the behavior of a portion of the circuit of FIG. 3 and further used in explaining the operation of the circuit of FIG. 3.

The resultant current which flows through resistance $R_{146}$, which is the feedback current $i_{fb}$ applied to the emitter electrode of transistor 121, is in phase with the voltage $v_{c_2}$. As may be seen from FIG. 5, the current $i_{fb}$ lags the voltage $v_{e_1}$ at the emitter electrode of transistor 121 by 90°, and hence an effective equivalent inductance is presented between the emitter electrode of transistor 121 and ground. A simplified equivalent circuit depicting the aforedescribed circuit behavior is shown in FIG. 6 wherein the effective inductance is designated as $L_{eq}$.

The equivalent inductance $L_{eq}$ and the capacitance $C_{1b'e}$ form a series resonant circuit having a resonant frequency slightly higher than the tank circuit resonant frequency $f_o$ and provide an effective capacitance smaller than that which would be provided in the absence of inductance $L_{eq}$. By varying the effective inductance $L_{eq}$, the effective capacitance in parallel with inductance $L_{134}$ may be varied, and the frequency of oscillation of the circuit will be changed accordingly.

The equivalent inductance $L_{eq}$ is inversely proportional to the equivalent generated current $i_{g_2}$ for the transistor 142, and which current is equal to the product of the transconductance $g_{m_2}$ for the transistor 142 and the transistor voltage $v_{2b'e}$. Since the transconductance $g_m$ of a transistor is directly proportional to the transistor emitter current, the transconductance $g_{m_2}$ of the transistor 142 (and hence the inductance $L_{eq}$) may be changed by varying the emitter current $i_{e_2}$ of the transistor 142.

In order to illustrate the forgoing with respect to operation of the circuit of FIG. 3, assume that the control voltage $v_{control}$ applied to terminal 124 is sufficiently negative to bias the transistor 142 to a cutoff condition. In such a condition the emitter current $i_{e_2}$ of transistor 142 is zero, producing an equivalent inductance $L_{eq}$ of a maximum value (theoretically approaching infinity). The effective capacitance in parallel with inductance 134 is of a minimum value, and the circuit oscillates at its highest frequency of oscillation. In this condition (transistor 142 cut off) the circuit of FIG. 3 operates as the Colpitts oscillator of FIG. 1.

When the control voltage $v_{control}$ applied to input terminal 124 is increased in a positive direction, the emitter current $i_{e_2}$ and the transconductance $g_{m_2}$ of the transistor 142 increase. The equivalent inductance $L_{eq}$ is thus decreased, thereby increasing the effective capacitance in parallel with inductance $L_{134}$ and lowering the oscillation frequency of the circuit in proportion to the increase in the input voltage. Hence, by applying an amplitude varying modulating voltage to input terminal 124, the instantaneous oscillation frequency of the circuit can be varied accordingly to produce a corresponding frequency modulated signal.

Since the equivalent inductance $L_{eq}$ changes as fast as the transconductance $g_{m_2}$ of transistor 142 can be changed, the oscillation frequency of the circuit of FIG. 3 theoretically can be changed instantaneously. In practice, however, the rate of change of this oscillation frequency appears to be limited by only the upper cutoff frequency of the transistor 142.

Moreover, since the transconductance $g_{m_2}$ of the transistor 142 can be varied over a large percentage range, large variations in the oscillation frequency of the circuit of FIG. 3 can be achieved. In fact, the circuit has oscillated at frequencies as low as one-half of its maximum (Colpitts) oscillation frequency. When the circuit is used as a frequency modulator, by biasing the transistor 142 such that the center frequency is midway between the aforementioned maximum and low oscillation frequencies, a frequency deviation range as great as 33 percent above and below the center frequency can be realized. Thus, the circuit of FIG. 3 is operable over a considerably wider frequency range of modulating voltages than with comparable prior art circuits, and is even operable over a wider frequency range of modulating voltages than the circuit of FIG. 1. In addition, with the circuit of FIG. 3, undesired amplitude variations in the output waveform are minimized due to the degenerative feedback provided by the transistor 142 and because the amplitude of the oscillating voltage at the collector electrode of transistor 121 is independent of the biasing of transistor 121.

Figure 7:
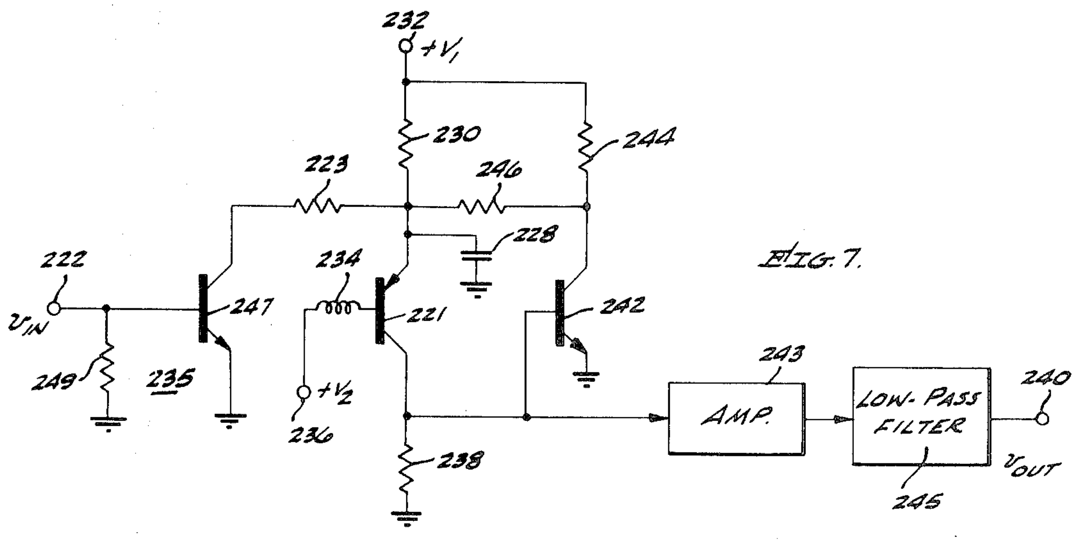
FIG. 7 is a schematic circuit diagram showing a phase-locked frequency modulation demodulator circuit in accordance with a still further embodiment of the invention.

A further embodiment of the present invention, in which a phase locked frequency modulation demodulator is provided, is illustrated in FIG. 7. The circuit of FIG. 7 is similar to the circuit of FIG. 3, and hence corresponding components in the circuit of FIG. 7 are designated by the same second and third reference numeral digits as their counterpart components in the circuit of FIG. 1, but bear a first reference numeral digit "2" instead of "1." The circuit of FIG. 7 differs from the circuit of FIG. 3, first, in that high-impedance input circuitry 235 is coupled between input terminal 222 and the emitter electrode of transistor 221 and, second, in that an amplifier 243 and a low-pass filter 245 are coupled between the collector electrode of transistor 221 and output terminal 240.

As shown in FIG. 7, exemplary circuitry which may be used for the high-impedance input circuitry 235 includes an NPN transistor 247 having its base electrode connected to input terminal 222, its emitter electrode connected to ground, and its collector electrode connected to resistor 223. A bias resistor 249 is connected between the base electrode of transistor 247 and ground. Amplifier 243, which may be a common emitter or a common base transistor amplifier, for example, decouples reactance components of low-pass filter 245 from the oscillator circuitry to prevent interference with phase locking of the oscillator circuitry onto the input signal frequency. Low-pass filter 245 prevents the carrier frequency from reaching output terminal 240 so that a demodulated video output signal is provided at terminal 240.

In the operation of the demodulator circuit of FIG. 7, transistor 242 is biased to an intermediate conductive level so that (in the same manner as set forth above with respect to the circuit of FIG. 3) the oscillator portion of the circuit of FIG. 7 will oscillate at a frequency $f_i$ intermediate its maximum and minimum oscillation frequencies. When an input voltage $v_{in}$ at a frequency $f_{in}$ within the range of frequencies at which the circuit will oscillate is applied to input terminal 222, the base-emitter diode of transistor 221 functions as a phase detector and compares the frequency $f_{in}$ with the frequency $f_i$ at which the circuit is oscillating. An error signal indicative of the frequency difference between the frequencies $f_{in}$ and $f_i$ is produced at the collector electrode of transistor 221. This error signal is applied to the base electrode of transistor 242 to adjust the emitter current $i_{e_2}$ of transistor 242 so as to cause the circuit to phase lock onto the input frequency $f_{in}$. When the input voltage $v_{in}$ carries frequency modulation, the error signal at the collector electrode of transistor 221 contains a corresponding demodulated signal. After removal of the carrier frequency in the low-pass filter 245, this error signal forms the demodulated output signal $v_{out}$ from the circuit.

As has been explained above with respect to the circuit of FIG. 3, the oscillation frequency of the oscillator portion of the circuit of FIG. 7 can be changed at a very high rate. Thus, the rate at which a phase-locked demodulator according to FIG. 7 is able to lock onto an incoming carrier signal is extremely fast, and in fact is faster than any known phase-locked demodulator according to the prior art. Moreover, the oscillator portion of the demodulator of FIG. 7 functions as an entire phase-locked loop, whereas in prior art phase-locked demodulators a separate oscillator and phase detector were required. Thus, a phase-locked demodulator according to the present invention not only eliminates circuit components but also reduces time delays due to the travel of signals between the various circuit portions. In addition, a phase-locked demodulator according to the invention provides a demodulated signal-to-noise ratio which at low carrier signal-to-noise ratios is substantially greater than that of prior art phase-locked demodulators. This improvement is realized because when a demodulator circuit according to the invention locks onto an incoming noise frequency, due to its fast locking capability it can return to the signal frequency before the next noise spike is received.

Figure 8:
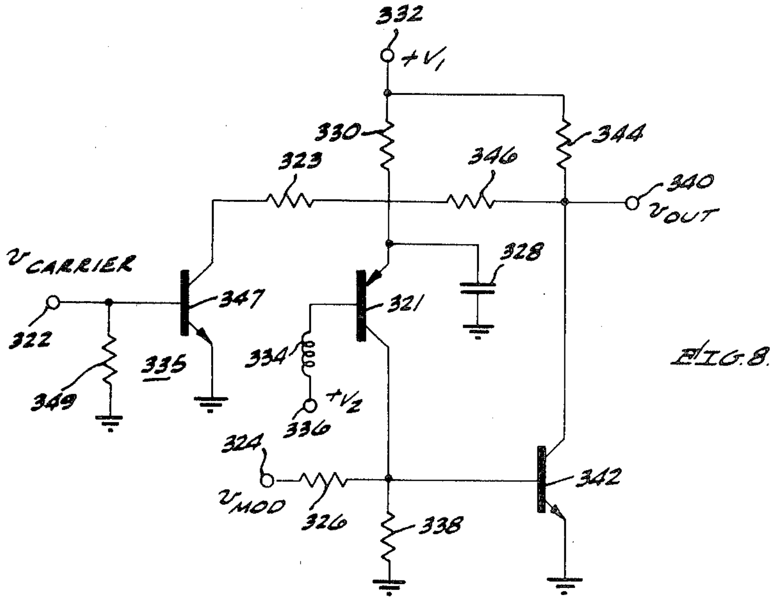
FIG. 8 is a schematic circuit diagram of a phase modulator circuit according to yet another embodiment of the invention.

A further embodiment of the present invention, in which a phase modulator circuit is provided, is illustrated in FIG. 8. The circuit of FIG. 8 is similar to the circuits of FIGS. 3 and 7, and hence corresponding components in the circuit of FIG. 8 are designated by the same second and third reference numeral digits as their counterpart components in FIGS. 3 and 7, but bear a first reference numeral digit "3" instead of "1" or "2." The circuit of FIG. 8 differs from that of FIG. 7 in that amplifier 243 and low-pass filter 245 are omitted and input terminal 324 and resistor 326 (similar to terminal 124 and resistor 126, respectively, of FIG. 3) are added to apply an input signal to the junction between the collector electrode of transistor 321 and the base electrode of transistor 342. In the circuit of FIG. 8 a radio frequency carrier voltage $v_{carrier}$ at a frequency $f_{carrier}$ within the range carrier . at which the circuit will oscillate is applied to input terminal 322, while an amplitude varying modulating voltage $v_{mod}$ is applied to input terminal 324. The output voltage $v_{out}$, consisting of the carrier voltage $v_{carrier}$ which has been phase modulated in accordance with the modulating voltage $v_{mod}$, is provided at output terminal 340.

The manner in which the phase-modulated output voltage $v_{out}$ is generated is as follows. The base-emitter diode of transistor 321 functions as a phase detector and compares the frequency $f_{carrier}$ of the input carrier voltage $v_{carrier}$ with the instantaneous frequency $f_2$ at which the circuit is oscillating. An error signal indicative of the frequency difference between the frequencies $f_{carrier}$ and $f_2$ is produced at the collector electrode of transistor 321. This error signal is applied to the base electrode of transistor 342 to adjust the emitter current of transistor 342 so as to cause the circuit to phase lock onto the carrier frequency $f_{carrier}$. When a modulating voltage $v_{mod}$ is applied to input terminal 324, the instantaneous oscillation frequency $f_2$ of the circuit of FIG. 8 is changed in proportion to the amplitude of the modulating voltage $v_{mod}$ in the manner described above with reference to the circuit of FIG. 3. The instantaneous phase difference between the carrier frequency signal and a signal at the instantaneous oscillation frequency of the circuit at the collector of transistor 321 is thus changed in proportion to the amplitude of the modulating voltage $v_{mod}$, producing phase modulation of the carrier voltage $v_{carrier}$.

The phase modulation produced by the circuit of FIG. 8 is a highly linear function of the modulating voltage amplitude and, in fact, has been found to have greater linearity than any known phase modulator according to the prior art. Moreover, as has been mentioned above with respect to a frequency modulator according to FIG. 3, not only can the instantaneous oscillation frequency of the phase modulator of FIG. 8 be changed at a very rapid rate, but also the circuit of FIG. 8 is operable over a wider frequency range of modulating voltages than with any known prior art phase modulator circuit. In addition, the output voltage from the circuit of FIG. 8 contains minimum undesired amplitude excursions due to the phase modulation.

Figure 9:
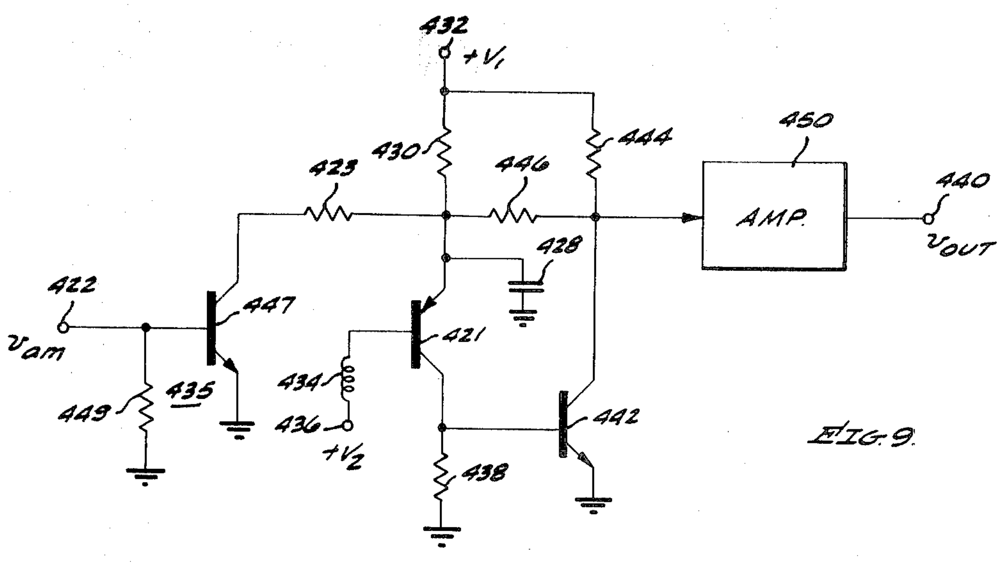
FIG. 9 is a schematic circuit diagram of an amplitude modulation limiter circuit in accordance with yet a further embodiment of the invention.

A further embodiment of the present invention, in which an amplitude modulation limiter is provided, is illustrated in FIG. 9. The circuit of FIG. 9 is similar to the circuit of FIG. 7, and hence corresponding components in the circuit of FIG. 9 are designated by the same second and third reference numeral digits as the counterpart components in the circuit of FIG. 7, but bear a first reference numeral digit "4" instead of "2." The circuit of FIG. 9 differs from that of FIG. 7 in that amplifier 243 and low-pass filter 245 are omitted, and an isolating amplifier 450 is added to translate signals from the collector electrode of transistor 442 to output terminal 440. Amplifier 450 may be a common emitter transistor amplifier, for example, and functions to isolate the circuit from reactive loading which may be coupled to the circuit output. In the circuit of FIG. 9 an amplitude modulated carrier voltage $v_{am}$ at a frequency within the range of frequencies at which the circuit will oscillate is applied to input terminal 422. The amplitude excursions on the voltage $v_{am}$ should not be so great as to drive any of the transistors 447, 421 or 442 out of their linear operating range. The output voltage $v_{out}$ provided at output terminal 440 consists of a reproduction of the input voltage $v_{am}$ but with the amplitude modulation substantially removed.

In the operation of the amplitude modulation limiter circuit of FIG. 9, the base-emitter diode of transistor 421 functions as a phase detector and compares the carrier frequency $f_{carrier}$ of the amplitude modulated input voltage $v_{am}$ with the instantaneous frequency $f_3$ at which the circuit is oscillating. An error signal indicative of the frequency difference between the frequencies $f_{carrier}$ and $f_3$ produced at the collector electrode of transistor 421 is applied to the base electrode of transistor 442 to adjust the emitter current of transistor 442 to cause the circuit to phase lock onto the carrier frequency $f_{carrier}$. As has been mentioned above with respect to the circuit of FIG. 3, on account of the degenerative feedback provided by the transistor 442 and because the amplitude of the oscillating voltage at the collector electrode of transistor 421 is independent of the biasing of transistor 421, amplitude variations on the voltage at the collector electrode of transistor 442 are minimized. Thus, the circuit of FIG. 9 is able to substantially remove amplitude modulation from the input voltage $V_{am}$ and produce a substantially constant amplitude output voltage $v_{out}$ at the carrier frequency $f_{carrier}$. It is pointed out that if the input voltage $v_{am}$ contains frequency modulation in addition to amplitude modulation, the output voltage $v_{out}$ from the circuit of FIG. 9 will retain the frequency modulation but will remove the amplitude modulation from the voltage $v_{am}$.

In amplitude modulation limiters of the prior art wherein the limiting is performed by diodes or transistors driven between saturation and cutoff, variations in the minority charge carrier storage times in these diodes or transistors have produced phase modulation due to the amplitude modulation being removed. Thus, these prior art circuits provide undesired AM to PM (amplitude modulation to phase modulation) conversion.

In the circuit of FIG. 9, however, the frequency and phase of the output voltage $v_{out}$ is substantially unaffected by the amplitude modulation on the input voltage $v_{am}$. Thus, the circuit of FIG. 9 provides amplitude modulation limiting with essentially no AM to PM conversion.

Circuits according to the present invention have exceptionally wide bandwidth capabilities and, therefore, their output contains high harmonic content. Accordingly, in a further embodiment of the present invention, illustrated in FIG. 10, a harmonic generator circuit is provided. The circuit of FIG. 10 is similar to the circuit of FIG. 3, and hence corresponding components in the circuit of FIG. 10 are designated by the same second and third reference numeral digits as their counterpart components in the circuit of FIG. 3, but bear a first reference numeral digit "5" instead off "1." The circuit of FIG. 10 differs from that of FIG. 3 in that an isolating amplifier 550 (similar to amplifier 450 of FIG. 9) is coupled to the collector electrode of transistor 542, and a band-pass filter 552 having its center frequency tuned to a desired harmonic frequency of the circuit oscillation frequency coupled between the amplifier 550 and output terminal 540.

As has been indicated above, the voltage at the collector electrode of transistor 542 contains components at harmonic frequencies $2f$, $3f$, $4f$, etc. of the fundamental oscillation frequency $f$ of the circuit, and which harmonic components have significant amplitudes relative to that of the fundamental frequency component. As an example of typical relative amplitudes, the second harmonic component may have an amplitude around one-third that of the fundamental component, and the third harmonic component an amplitude around one-ninth that of the fundamental component (higher order harmonics may have amplitudes comparable to that of the third harmonic). By tuning band-pass filter 552 to the desired harmonic frequency of the fundamental oscillation frequency of the circuit, signals at the fundamental frequency and at undesired harmonic frequencies can be blocked, thereby enabling a signal $v_{harmonic}$ at the desired harmonic frequency to be obtained at output terminal 540. As has been indicated above with respect to the circuit of FIG. 3, by varying the control voltage $v_{control}$ applied to input terminal 522 or 524 the oscillation frequency of the circuit can be changed, and the harmonic output frequency from the circuit varied accordingly.

Figure 10:
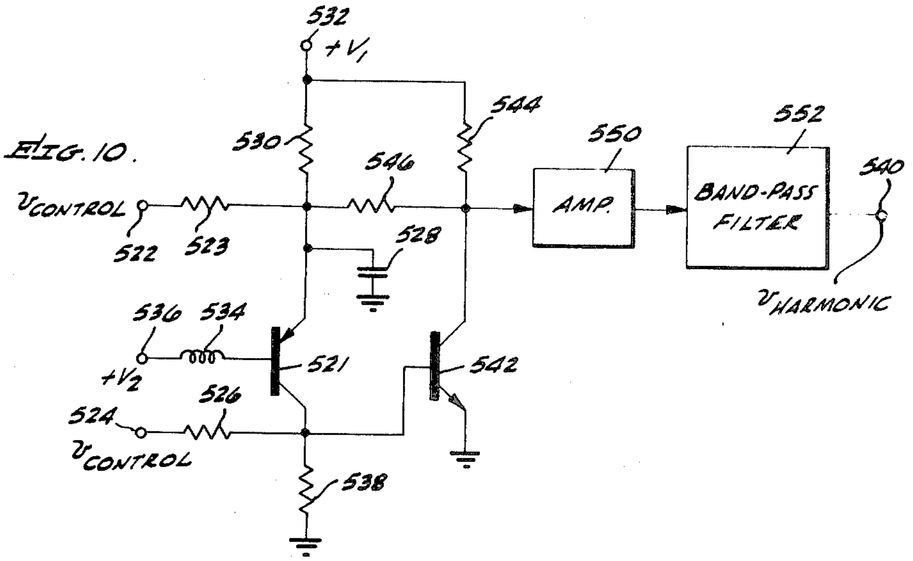
FIG. 10 is a schematic circuit diagram illustrating a harmonic generator circuit in accordance with a still further embodiment of the invention.
Figure 11:
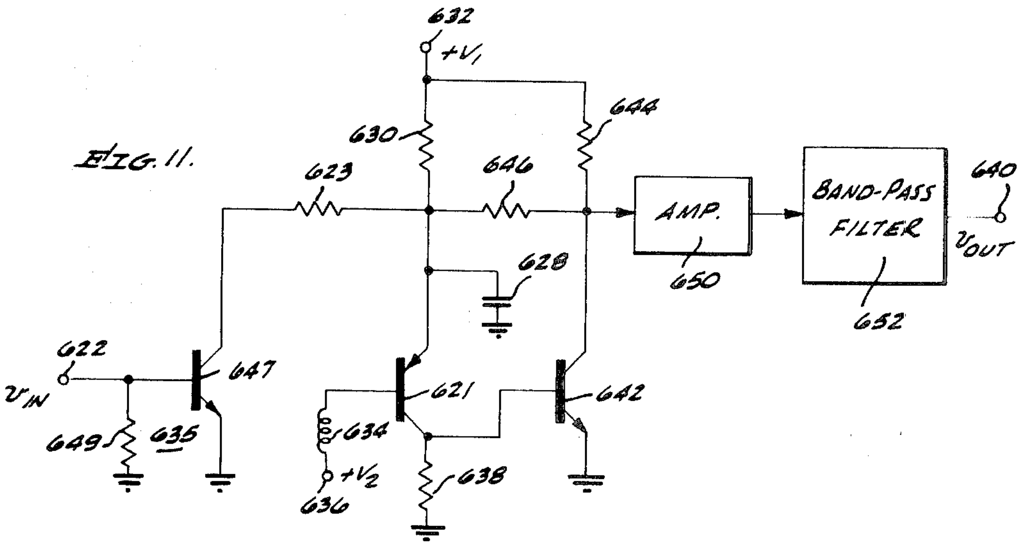
FIG. 11 is a schematic circuit diagram showing a frequency multiplier/divider circuit according to yet a further embodiment of the invention.

A still further embodiment of the present invention, in which a frequency multiplier/divider circuit is provided, is illustrated in FIG. 11. The circuit of FIG. 11 is similar to the circuits of FIGS. 7 and 10, and hence corresponding components in the circuit of FIG. 11 are designated by the same second and third reference numeral digits as their counterpart components in FIGS. 7 and 10, but bear a first reference numeral digit "6" instead of "2" or "5." The circuit of FIG. 11 differs from that of FIG. 10 in that input terminal 524 and resistor 526 are omitted and high-impedance input circuitry 635 (similar to input circuitry 235 of FIG. 7) is coupled between input terminal 622 and the emitter electrode of transistor 621.

In the operation of the circuit of FIG. 11, in the absence of a signal at input terminal 622, the circuit functions in the same manner as the circuit of FIG. 10, i.e., the circuit oscillates at a fundamental frequency $f$ and also at harmonic frequencies $2f$, $3f$, $4f$, etc. of the frequency $f$. When an input voltage $v_{in}$ of an amplitude and frequency sufficient to enable the circuit to phase lock onto the input signal frequency is applied to input terminal 622, the circuit of FIG. 11 will phase lock onto the input signal frequency in the same manner as explained above with reference to the circuit of FIG. 7.

Figure 12:
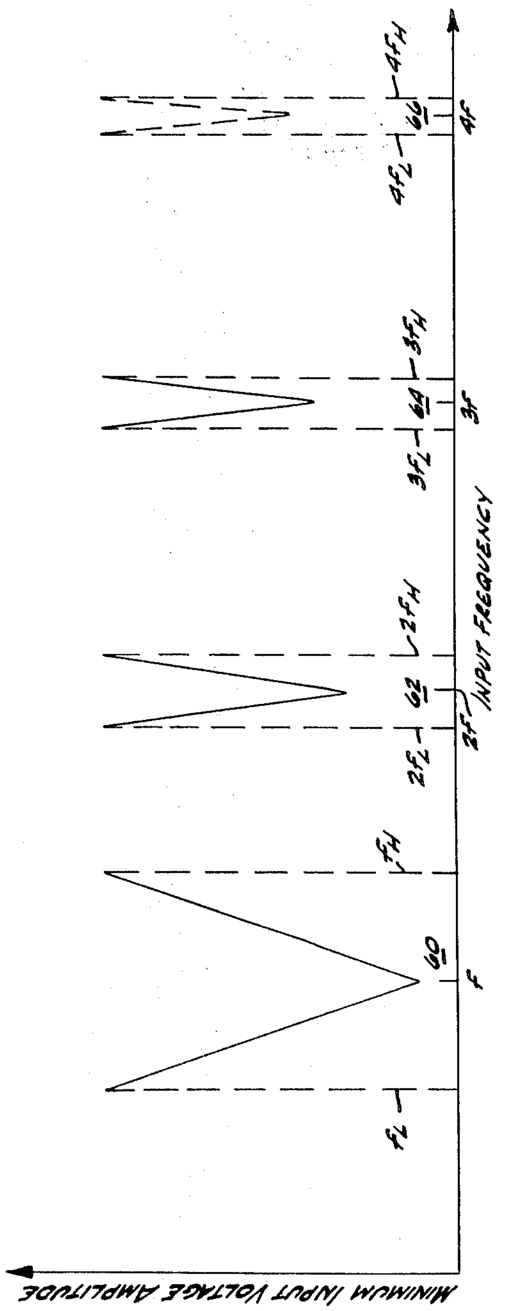
FIG. 12 is a graph illustrating the minimum input voltage amplitude as a function of input frequency capable of phase locking the circuit of FIG. 11 onto the input frequency.

The relationship between the minimum input voltage amplitude and input frequency which will result in phase locking of the circuit of FIG. 11 is illustrated in FIG. 12. Specifically, the circuit will phase lock to the input signal frequency when the input frequency lies within respective frequency bands 60, 62, 64 and 66 centered around the fundamental and harmonic oscillation frequencies $f$, $2f$, $3f$ and $4f$, respectively, of the circuit. Each of the frequency bands 60, 62, 64 and 66 extends between a lower cutoff frequency designated by the subscript "L" and a higher cutoff frequency designated by the subscript "H." As shown in FIG. 12, the bandwidth of the frequency bands 60, 62, 64 and 66 decreases as a function of increasing frequency, and the minimum amplitude of input voltage which will enable phase locking of the circuit generally increases as the harmonic order increases. Moreover, the minimum input voltage amplitude required for phase locking increases linearly as a function of frequency deviation from the respective center frequencies of the locking bands, i.e. the frequencies $f$, $2f$, $3f$ and $4f$. Thus, as may be seen from FIG. 12, an input voltage of greater amplitude is generally required in order to phase lock the circuit onto harmonic frequencies than onto the fundamental frequency, and the input voltage amplitude required for phase locking increases as the input frequency is moved away from the natural fundamental and harmonic oscillation frequencies of the circuit.

As an example of the operation of the circuit of FIG. 11 as a frequency multiplier, when the voltage $v_{in}$ applied to input terminal 622 is at a frequency $f_4$ lying within frequency band 60 centered around the fundamental oscillation frequency $f$, the circuit will phase lock to the frequency $f_4$. The voltage at the collector electrode of transistor 642 will contain components at the fundamental oscillation frequency $f_4$ and at the harmonic frequencies $2f_4$, $3f_4$, $4f_4$, etc. If band-pass filter 652 were tuned so as to pass signals at the frequency $3f_4$, for example, and reject signals at the remaining frequencies, an output voltage $v_{out}$ at the frequency $3f_4$ would be provided, and the circuit of FIG. 11 would function to multiply the input frequency $f_4$ by the factor 3. Thus, by tuning filter 652 to a particular harmonic of a given input frequency, a desired multiplication factor can be selected for the circuit.

As an example of the operation of the circuit of FIG. 11 as a frequency divider (or a fractional multiplier), when the voltage $v_{in}$ applied to input terminal 622 is at a frequency $f_5$ lying within frequency band 62 centered around the second harmonic oscillation frequency $2f$, the circuit will phase lock to the frequency $f_5$. The voltage at the collector electrode of transistor 642 will not only contain a component at the frequency $f_5$, but will also contain components at the subharmonic frequency $\frac{1}{2}f_5$ and the harmonic frequencies $3/2f_5$, $2f_5$, etc. If band-pass filter 652 were tuned so as to pass signals at the frequency $\frac{1}{2}f_5$, for example, and reject signals at the remaining frequencies, the circuit of FIG. 11 would function to divide the input frequency $f_5$ by the factor 2. (Alternatively, this may be viewed as multiplying the frequency $f_5$ by the fraction ½). If filter 652 were tuned so as to pass signals at the frequency $3/2f_5$ while rejecting signals at other frequencies, the circuit of FIG. 11 would function to multiply the input frequency $f_5$ by the factor 3 and also divide the frequency $f_5$ by the factor 2 (alternatively viewed as multiplication by the fraction 3/2).

When the input voltage $v_{in}$ is at a frequency $f_6$ lying within frequency band 64 centered around the third harmonic frequency $3f$, the circuit will phase lock to the frequency $f_6$ and will generate signals at the frequencies $\frac{1}{3}f_6$, $\frac{2}{3}f_6$, $f_6$, $4/3f_6$ etc., any of which may be obtained at output terminal 640 by suitable tuning of band-pass filter 652. Thus, by appropriate selection of input signal frequencies and tuning of band-pass filter 652, the circuit of FIG. 11 can function as a frequency multiplier or a frequency divider, or both. When used as a frequency multiplier, the circuit has an advantage over prior art multipliers in that both integral and fractional frequency multiplication can be achieved. When employed as a frequency divider, the circuit of FIG. 11 is able to divide higher frequencies than has been achieved with the prior art.

When the voltage $v_{in}$ applied to input terminal 622 contains frequency modulation, the circuit of FIG. 11 functions to multiply the frequency deviation from the carrier frequency by the same amount that it multiplies the carrier frequency. For example, if the voltage $v_{in}$ applied to terminal 622 is at a carrier frequency $f_7$ which has been frequency modulated with a frequency deviation $\Delta f$, and band-pass filter 652 is tuned to pass frequencies in the vicinity of the harmonic frequency $2f_7$, the output voltage $v_{out}$ will be at a carrier frequency $2f_7$ which is frequency modulated with a frequency deviation $2\Delta f$. Thus, the circuit of FIG. 11 can multiply the frequency deviation, and hence the modulation index (the ratio of the frequency deviation to the frequency of the modulating wave in a frequency modulation system when using a sinusoidal modulating wave), by a preselected factor. However, when employing the circuit of FIG. 11 for frequency modulation index multiplication, the carrier frequency is multiplied by the same factor as the modulation index.

Figure 13:
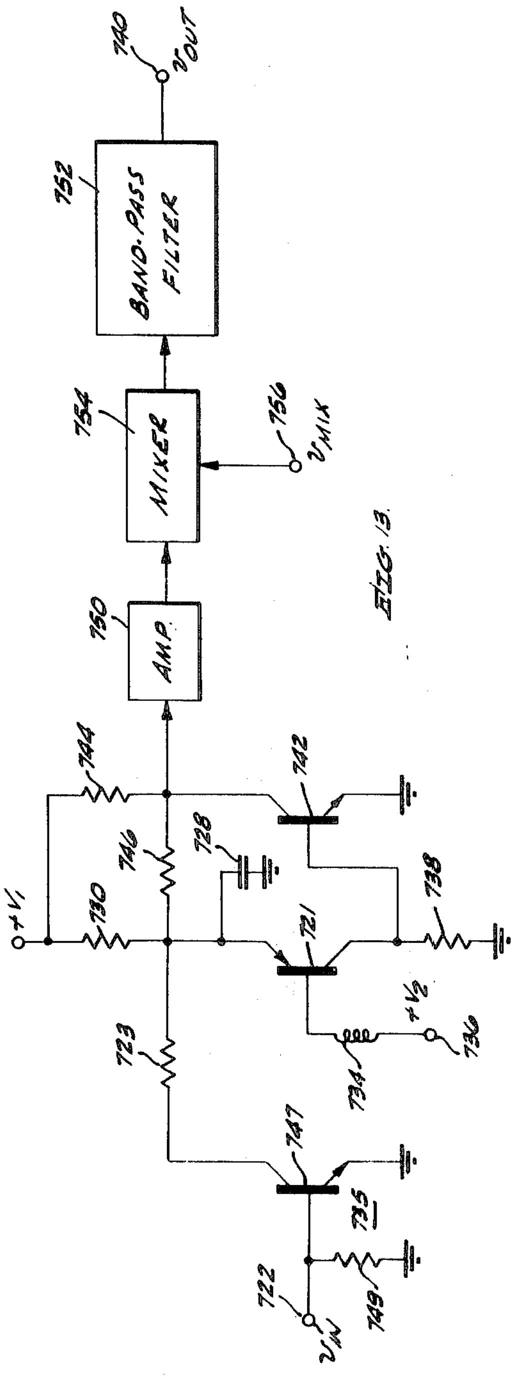
FIG. 13 is a schematic circuit diagram illustrating a frequency modulation index multiplier/divider circuit in accordance with a still further embodiment of the invention.

In accordance with a further embodiment of the present invention, illustrated in FIG. 13, a modulation index multiplier/divider circuit is provided wherein the original carrier frequency is retained. The circuit of FIG. 13 is similar to the circuit of FIG. 11, and hence corresponding components in the circuit of FIG. 13 are designated by the same second and third reference numeral digits as their counterpart components in the circuit of FIG. 11, but bear a first reference numeral digit "7" instead of "6." The circuit of FIG. 13 differs from that of FIG. 11 in that a mixer 754 is coupled between isolating amplifier 750 and band-pass filter 752. However, in some instances mixer 754 may provide sufficient isolation so that amplifier 750 could be eliminated and mixer 754 coupled directly to the collector electrode of transistor 742. A mixing voltage $v_{mix}$ at a frequency $f_{mix}$ selected to provide the desired carrier frequency at output terminal 740 is applied to the mixer 754 via an auxiliary input terminal 756.

The operation of the portion of the circuit of FIG. 13 prior to mixer 754 is the same as that of the circuit of FIG. 11. Specifically, when a frequency modulated input voltage $v_{in}$ of the proper carrier frequency and amplitude is applied to input terminal 722, the circuit will phase lock onto the carrier frequency of the voltage $v_{in}$ and will generate at the collector electrode of transistor 742 respective frequency-modulated carrier signals at the input carrier frequency and at harmonic frequencies of the input carrier frequency. The frequency modulation on these generated signals will be proportional to that of the input voltage $v_{in}$ but have a frequency deviation multiplied by the order of the harmonic in question. Mixing of the respective frequency-modulated signals at the collector electrode of transistor 742 with a selected mixing voltage $v_{mix}$ in mixer 754 will produce respective signals at the sum and difference frequencies of the frequency-modulated signals and the mixing voltage. By tuning band-pass filter 752 to the desired sum or difference frequency, a frequency modulated output voltage $v_{out}$ may be obtained at the desired sum or difference carrier frequency but with a frequency deviation a selected multiple or fraction of that on the input voltage $v_{in}$.

As a specific example illustrative of the operation of the circuit of FIG. 13, assume that the frequency-modulated input voltage $v_{in}$ applied to terminal 722 is at a carrier frequency $f_8$ and has a frequency deviation $\Delta f$, and that is desired to provide a frequency-modulated output voltage at the same carrier frequency $f_8$ but with frequency modulation having a frequency deviation $3\Delta f$. The desired output voltage may be realized with the circuit of FIG. 13 by tuning band-pass filter 752 to pass frequencies in the vicinity of the frequency $f_8$ and by applying to mixer input terminal 756 a mixing voltage $v_{mix}$ at the frequency $2f_8$. As has been explained above, included among the various signals generated at the collector electrode of transistor 742 in response to the aforementioned frequency-modulated input voltage at the carrier frequency $f_8$ will be a carrier signal at the third harmonic frequency $3f_8$ which is frequency modulated with a frequency deviation $3\Delta f$. When this third harmonic signal is mixed with a mixing voltage at the frequency $2f$, a sum frequency carrier signal at the frequency $3f_8+2_8=5f_8$ and a difference frequency carrier signal at the frequency $3f_8-2f_8=f_8$ will be produced, each containing frequency modulation with the expanded frequency deviation $3\Delta f$. The tuning of band-pass filter 752 to the frequency $f_8$ will enable the difference frequency signal at essentially the frequency $f_8$ to be provided at output terminal 740. Since this difference frequency signal carries frequency modulation with a frequency deviation of $3\Delta f$, it may be seen that the circuit of FIG. 13 functions to multiply the modulation index of a frequency-modulated carrier signal while retaining the original carrier frequency.

It should be apparent from the foregoing that numerous modifications and variations are possible for circuits according to the invention. Hence, although the invention has been shown and described with reference to particular embodiments, various changes and modifications obvious to a person skilled in the art are deemed to lie within the purview of the invention.

What is claimed is:

1. A variable frequency oscillator circuit comprising: a transistor having an emitter electrode, a collector electrode, and a base electrode; first, second, and third terminals to which circuit operating potentials are applied, said first terminal being coupled to said emitter electrode, said third terminal being coupled to said collector electrode; means for providing an inductance between said base electrode and said second terminal and for providing a capacitance between said emitter electrode and said third terminal, whereby circuit oscillation may be achieved; and feedback means coupled between said collector and emitter electrodes for providing an effective inductance in parallel with said capacitance and for varying said effective inductance in accordance with a control signal to vary the oscillation frequency of the circuit.

2. A variable frequency oscillator circuit according to claim 1 wherein said feedback means includes a second transistor having a base electrode coupled to said collector electrode a collector electrode coupled to said emitter electrode and to said first terminal, and an emitter electrode coupled to said third terminal, and means for varying the transconductance of said second transistor in accordance with said control signal.

3. A variable frequency oscillator circuit comprising: a first transistor having an emitter electrode, a collector electrode, and a base electrode; first, second, and third terminals to which circuit-operating potentials are applied, said first terminal being coupled to said emitter electrode, said third terminal being coupled to said collector electrode; means for providing an inductance between said base electrode and said second terminal and for providing a capacitance between said emitter electrode and said third terminal, whereby circuit oscillation may be achieved; means including a second transistor for varying the effective capacitance in parallel with said inductance in accordance with a control signal to vary the oscillation frequency of the circuit; said second transistor having a base electrode coupled to the collector electrode of said first transistor and having respective emitter and collector electrodes coupled to said third and first terminals, respectively; and said means including said second transistor further including a feedback impedance coupled between the collector electrode of said second transistor and the emitter electrode of said first transistor.

4. A variable frequency oscillator circuit according to claim 3 wherein said second transistor is of a conductivity type complementary to that of said first transistor.

5. A frequency modulator circuit comprising: a transistor having an emitter electrode, a collector electrode, and a base electrode; first, second, and third terminals to which circuit operating potentials are applied, said first terminal being coupled to said emitter electrode, said third terminal being coupled to said collector electrode; means for providing an inductance between said base electrode and said second terminal and for providing a capacitance between said emitter electrode and said third terminal, whereby circuit oscillation may be achieved; and means including a feedback transistor for providing an effective inductance in parallel with said capacitance and for varying said effective inductance in accordance with an amplitude-varying modulating signal to vary the instantaneous oscillation frequency of the circuit and produce a corresponding frequency-modulated signal, said feedback transistor having a base electrode coupled to said collector electrode, a collector electrode coupled to said emitter electrode and to said first terminal, and an emitter electrode coupled to said third terminal.

6. A frequency modulator circuit comprising: a transistor having an emitter electrode, a collector electrode, and a base electrode; first, second, and third terminals to which circuit operating potentials are applied, said first terminal being coupled to said emitter electrode, said third terminal being coupled to said collector electrode; means for providing an inductance between said base electrode and said second terminal and for providing a capacitance between said emitter electrode and said third terminal, whereby circuit oscillation may be achieved; means including a second transistor for varying the effective capacitance in parallel with said inductance in accordance with an amplitude varying modulating signal to vary the instantaneous oscillation frequency of the circuit and produce a corresponding frequency modulated signal; said second transistor having a base electrode coupled to the collector electrode of said first transistor and having respective emitter and collector electrodes coupled to said third and first terminals, respectively; and said means including said second transistor further including a feedback impedance coupled between the collector electrode of said second transistor and the emitter electrode of said first transistor.

7. A variable frequency oscillator circuit according to claim 3 wherein said control signal is applied to the base electrode of said second transistor.

8. A variable frequency oscillator circuit according to claim 8 wherein a first load impedance is coupled between said first terminal and the emitter electrode of said first transistor, a second load impedance is coupled between said first electrode and the collector electrode of said second transistor, and a third load impedance is coupled between said third terminal and the collector electrode of said first transistor.

9. A frequency modulator circuit according to claim 6 wherein said amplitude-varying modulating signal is applied to the base electrode of said second transistor.

10. A frequency modulator circuit according to claim 6 wherein a first load impedance is coupled between said first terminal and the emitter electrode of said first transistor, a second load impedance is coupled between said first electrode and the collector electrode of said second transistor, and a third load impedance is coupled between said third terminal and the collector electrode of said first transistor.